United States Patent
Hwang et al.

(10) Patent No.: US 11,874,357 B2
(45) Date of Patent: Jan. 16, 2024

(54) METHOD AND DEVICE FOR GENERATING FAT SUPPRESSION MAGNETIC RESONANCE IMAGE USING GENERATIVE ADVERSARIAL NEURAL NETWORK BASED ON THE BLOCH EQUATION

(71) Applicant: UIF (University Industry Foundation), Yonsei University, Seoul (KR)

(72) Inventors: Do Sik Hwang, Seoul (KR); Sungjun Kim, Seoul (KR); Young Han Lee, Seoul (KR); Se Won Kim, Seoul (KR)

(73) Assignee: UIF (UNIVERSITY INDUSTRY FOUNDATION), YONSEI UNIVERSITY, Seoul (KR)

( * ) Notice: Subject to any disclaimer, the term of this patent is extended or adjusted under 35 U.S.C. 154(b) by 135 days.

(21) Appl. No.: 17/719,931

(22) Filed: Apr. 13, 2022

(65) Prior Publication Data
US 2022/0326328 A1 Oct. 13, 2022

(30) Foreign Application Priority Data
Apr. 13, 2021 (KR) .......... 10-2021-0047901

(51) Int. Cl.
*G01R 33/56* (2006.01)
*G01R 33/50* (2006.01)
*G06T 7/00* (2017.01)

(52) U.S. Cl.
CPC .......... *G01R 33/5607* (2013.01); *G01R 33/50* (2013.01); *G06T 7/0012* (2013.01); *G06T 2207/10088* (2013.01); *G06T 2207/20081* (2013.01)

(58) Field of Classification Search
CPC .. G01R 33/5607; G01R 33/50; G06T 7/0012; G06T 2207/10088; G06T 2207/20081
See application file for complete search history.

(56) References Cited

U.S. PATENT DOCUMENTS

2021/0302522 A1\* 9/2021 Zhong .............. G06N 3/08

FOREIGN PATENT DOCUMENTS

KR 10-2021-0017290 A 2/2021

\* cited by examiner

*Primary Examiner* — G. M. A Hyder
(74) *Attorney, Agent, or Firm* — Paratus Law Group, PLLC (57) ABSTRACT

The disclosed technology relates to a method and device for generating a fat suppression magnetic resonance image. The method includes: inputting, by an imaging device, a magnetic resonance image to an encoder of a neural network to extract features of the magnetic resonance image; and generating, by a generator of the neural network, a T2-weighted fat suppression image based on the features, in which the neural network is trained according to a result of discriminating, by a discriminator of the neural network, a loss due to a generation of a T2-weighted fat suppression image and as a result of reconstructing, by a decoder, the magnetic resonance image input to the encoder using a Bloch equation before the magnetic resonance image is input.

11 Claims, 5 Drawing Sheets

METHOD AND DEVICE FOR GENERATING FAT SUPPRESSION MAGNETIC RESONANCE IMAGE USING GENERATIVE ADVERSARIAL NEURAL NETWORK BASED ON THE BLOCH EQUATION

CROSS-REFERENCE TO RELATED APPLICATION

This application claims priority to Korean Patent Application No. 10-2021-0047901 filed on Apr. 13, 2021, which is hereby incorporated by reference in its entirety.

BACKGROUND

The disclosed technology relates to a method and device for generating a fat suppression magnetic resonance image using a generative adversarial neural network based on a Bloch equation.

Magnetic resonance imaging is performed by a device including magnets that emits high frequency waves to the human body to resonate hydrogen nuclei in specific parts of the human body such that a difference in signals generated in each tissue is converted into digital data and the converted digital data consists of an image. In general, since resolution and contrast of soft tissues such as muscles or ligaments are high, there is an advantage for acquiring high-resolution images without using a special material such as a contrast agent.

A magnetic resonance image is one of the most widely used medical images, and image analysis technology using a neural network has been used to more objectively analyze such medical images. There may be a problem in that a medical staff may make a diagnosis reflecting his/her own subjectivity or an unintentionally biased diagnosis. In particular, when the distinction between fat and disease is ambiguous, the above problem may occur more frequently because it depends on the subjectivity and experience of the medical staff. However, when a neural network trained from a large amount of data is used, medical images may be analyzed more objectively.

Meanwhile, in a process of training a neural network for analyzing medical images, the related art has a problem in that detailed features included in an original image are omitted since network normalization is performed using only a loss function applied to the neural network. Accordingly, a technology for generating more precise images by preserving these detailed features is required.

RELATED ART DOCUMENT

Patent Document

Korean Patent Laid-Open Publication No. 10-2021-0017290

SUMMARY

The disclosed technology provides a method and device for generating a fat suppression magnetic resonance image using a generative adversarial neural network based on a Bloch equation.

To achieve the above technical objective, a first aspect of the disclosed technology provides a method of generating a fat suppression magnetic resonance image, including: inputting, by an imaging device, a magnetic resonance image to an encoder of a neural network to extract features of the magnetic resonance image; and generating, by a generator of the neural network, a T2-weighted fat suppression image based on the features, in which the neural network is trained according to a result of discriminating, by a discriminator of the neural network, a loss due to a generation of a T2-weighted fat suppression image and as a result of reconstructing, by a decoder, the magnetic resonance image input to the encoder using a Bloch equation before the magnetic resonance image is input.

To accomplish the above technical problems, a first aspect of the disclosed technology provides a device for generating a fat suppression magnetic resonance image, including: an input device configured to receive T1 and T2 magnetic resonance images; a storage device configured to store a generative adversarial neural network based on a Bloch equation including an encoder, a decoder, a generator, and a discriminator as sub-networks; and a computing device configured to generate a magnetic resonance image having a contrast different from the T2-weighted fat suppression image based on the extracted features using the generator, in which the generative adversarial neural network based on the Bloch equation is trained according to a result of discriminating, by the discriminator, a loss due to a generation of the T2-weighted fat suppression image and as a result of reconstructing, by the decoder, the magnetic resonance image input to the encoder using the Bloch equation before the T1 and T2 magnetic resonance images are input.

Embodiments of the disclosed technology can have effects including the following advantages. However, since it does not mean that the embodiments of the disclosed technology should include all of them, the scope of the disclosed technology should not be construed as being limited thereto.

According to a method and device for generating a fat suppression magnetic resonance image using a generative adversarial neural network based on a Bloch equation according to an embodiment of the disclosed technology, it is possible to generate magnetic resonance images of different contrasts without additional imaging.

In addition, it is possible to preserve detailed features in an image by reconstructing the image using a Bloch equation suitable for each contrast image.

In addition, it is possible to more accurately identify inflammatory diseases such as bone marrow edema.

DETAILED DESCRIPTION

Since the present invention may be variously modified and have several embodiments, specific embodiments will be illustrated in the accompanying drawings and described in detail in a detailed description. However, it is to be understood that the present invention is not limited to the specific embodiments, but includes all modifications, equivalents, and substitutions without departing from the scope and spirit of the present invention.

Terms such as "first," "second," "A," and "B," may be used to describe various components, but the components are not to be interpreted as being limited to the terms and are used only for distinguishing one component from other components. For example, a "first" component may be named a "second" component and the "second" component may also be similarly named the "first" component, without departing from the scope of the present invention. The term "and/or" includes a combination of a plurality of related described items or any one of the plurality of related described items.

A singular expression in terms used herein should be understood to include a plural expression unless the context clearly dictates otherwise. It will be further understood that terms such as "comprising" mean the presence of stated features, numbers, steps, operations, components, parts, or a combination thereof, but do not preclude the presence or addition of one or more other features, numbers, steps, operations, components, parts, or a combination thereof.

Prior to the detailed description of the drawings, it is intended to clarify that the components in this specification are merely distinguished by the main functions of each component. That is, two or more components to be described below may be combined into one component, or one component may be divided into two or more for each subdivided function.

In addition, each component to be described below may additionally perform some or all of the functions that other components are responsible for, in addition to main functions that the components are responsible for, and it goes without saying that some of the main functions that each of the components are responsible for may be exclusively performed by other components. Therefore, the presence or non-presence of each component described through the present specification should be interpreted functionally.

Figure 1:
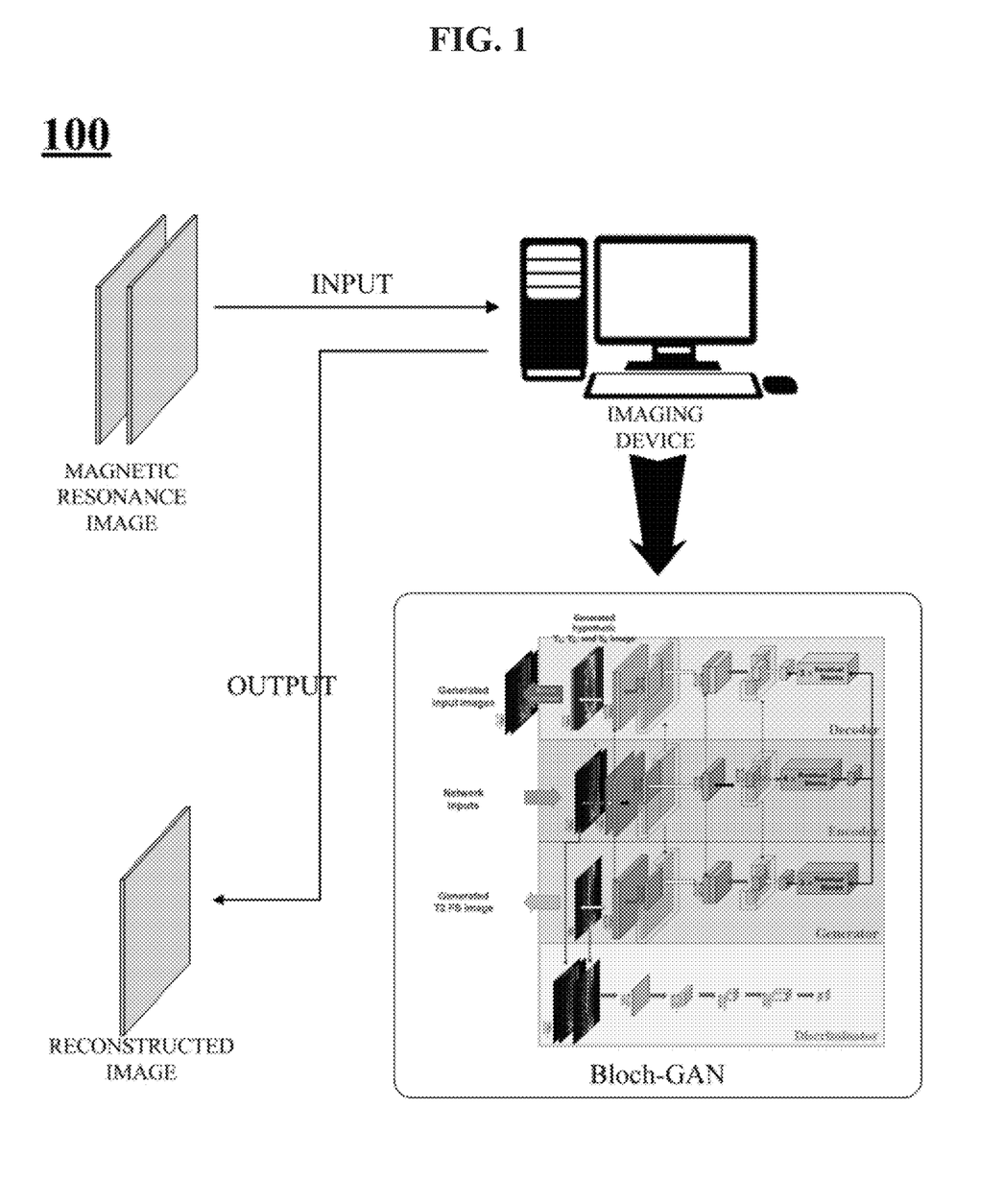
FIG. 1 is a diagram illustrating a process of generating a fat suppression magnetic resonance image using a generative adversarial neural network based on a Bloch equation according to an embodiment of the disclosed technology.

FIG. 1 is a diagram illustrating a process of generating a fat suppression magnetic resonance image using a generative adversarial neural network based on a Bloch equation according to an embodiment of the disclosed technology. Referring to FIG. 1, an imaging device may receive magnetic resonance images having two different contrasts, and may generate magnetic resonance images having different contrasts based on the received magnetic resonance images. The two magnetic resonance images input to the imaging device may be a T1-weighted image and a T2-weighted image obtained by capturing the same body tissue at the same time. In addition, the images generated based on the T1 and T2-weighted images may be a T2-weighted fat suppression image.

To generate the T2-weighted fat suppression image, the imaging device uses a generative adversarial neural network based on a Bloch equation. By inputting the input magnetic resonance image into the generative adversarial neural network, it is possible to discriminate a loss due to the generation of the T2-weighted fat suppression image and calculate a loss due to the reconstruction of the magnetic resonance image. The imaging device may train a neural network based on the result of discriminating the loss due to image generation and the result of calculating the loss due to image reconstruction.

The image input to the imaging device may be a magnetic resonance image of a specific tissue or organ of a patient. The imaging device may use images captured with different contrasts at the same time. For example, a T1-weighted image and a T2-weighted image of a patient's spine may be input. Such an image may be captured through a capturing device included in the imaging device or may be acquired using a separate capturing device connected to the imaging device. The acquired magnetic resonance image may be input to the neural network stored in the imaging device and reconstructed into an image having a different contrast from the captured image.

Meanwhile, the imaging device basically generates the T2 fat suppression image using the T1 image. To this end, a non-captured contrast image may be generated using a relationship between each contrast image using the generative adversarial neural network based on a Bloch equation. Prior to the image generation, the imaging device may perform a process of training the generative adversarial neural network. The generative adversarial neural network includes an encoder, a decoder, a generator and a discriminator as sub-networks. The imaging device may normalize the entire network using the discriminator and the decoder in the process of training the neural network.

Meanwhile, in the training process, the imaging device may receive the T1-weighted image and the T2-weighted image. The T2-weighted fat suppression image may be generated based on the input images having different contrasts. In an embodiment, the features of the magnetic resonance image may be extracted using the encoder of the generative adversarial neural network based on a Bloch equation, and the T2-weighted fat suppression image may be generated based on the extracted features using the generator. In addition, the discriminator may discriminate the loss due to the generation of the fat suppression image, and the decoder may reconstruct the magnetic resonance image input to the encoder using the Bloch equation. When the training is performed according to this process, the image may be generated using only the encoder and the generator in the subsequent image analysis process. That is, the discriminator and the decoder are sub-networks used only in the training process, and after the training of the entire network is completed using the image loss determined by the discriminator and the reconstruction loss calculated by the decoder, the features of the input image are extracted using only the encoder and generator, and then the T2-weighted fat suppression image may be generated based on the extracted features.

Meanwhile, in the training process, the decoder may generate a hypothetical magnetic resonance parameter map and reconstruct the image using a Bloch equation suitable for each contrast image. Here, the magnetic resonance parameter map generated by the decoder includes a T1 magnetic relaxation rate map, a T2 magnetic relaxation rate map, and a proton density map. That is, the decoder may reconstruct an image having a different contrast from the image input to the neural network by using this quantitative parameter map.

Since the conventional neural network-based magnetic resonance image analysis technique provides only a loss function for image comparison, there is a problem in that detailed features included in an image are omitted during image reconstruction. Of course, even by using such a conventional technique, it is possible to perform objective image analysis to some extent, but in order to more accurately identify a lesion, it is necessary to reconstruct the image by reflecting detailed features included in the image. In the disclosed technology, detailed information lost according to the data processing process of the network may be preserved by normalizing the network using the Bloch equation and replacing the pooling and unpooling layers included in the conventional network by using the wavelet transform. By reconstructing the image in this way, it is possible to show higher accuracy than the related art in identifying lesions such as bone marrow edema.

Figure 2:
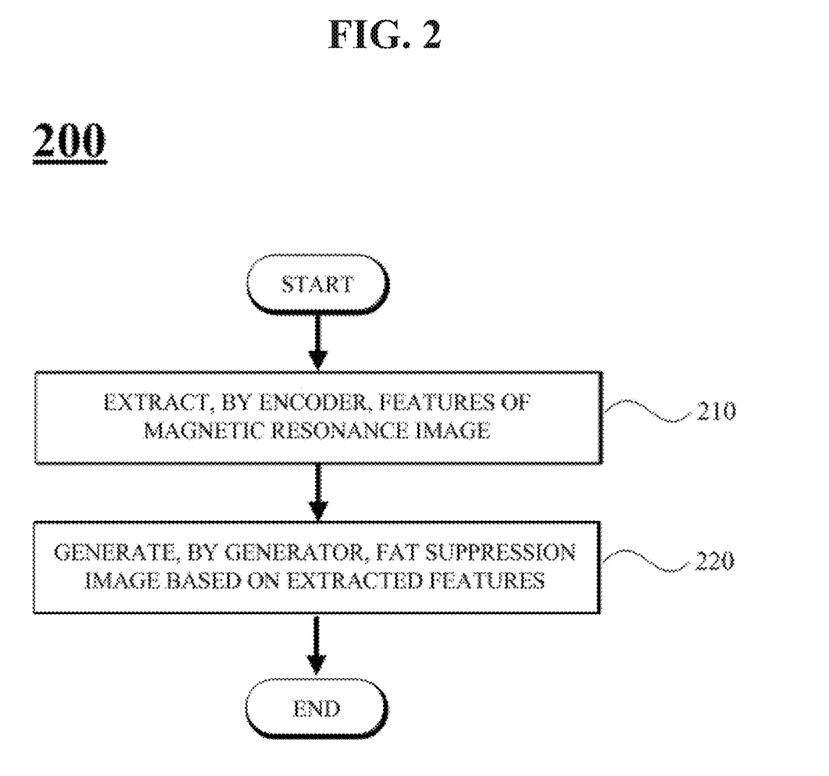
FIG. 2 is a flowchart of a method of generating a fat suppression magnetic resonance image using a generative adversarial neural network based on a Bloch equation according to the embodiment of the disclosed technology.

FIG. 2 is a flowchart of a method of generating a fat suppression magnetic resonance image using a generative adversarial neural network based on a Bloch equation according to the embodiment of the disclosed technology. Referring to FIG. 2, the method 200 of generating a magnetic resonance image includes a feature extracting step 210 and a T2-weighted fat suppression image generating step 220, which may be sequentially performed through the generative adversarial neural network based on a Bloch equation stored in the imaging device. The imaging device may receive the magnetic resonance image and input the received magnetic resonance image to the neural network, and the neural network may generate the T2-weighted fat suppression image based on the input image.

In step 210, the imaging device inputs the magnetic resonance image to the encoder of the neural network. The encoder of the neural network extracts the features of the input magnetic resonance image. The imaging device stores a pre-trained generative adversarial neural network based on a Bloch equation for image reconstruction. Then, when the magnetic resonance image is input, the image is input to the encoder of the neural network to extract the features of the image. The features included in the image may be extracted through a plurality of layers included in the encoder.

In step 220, the generator of the neural network generates the fat suppression image based on the extracted features. The magnetic resonance image input in step 210 may be the T1-weighted image and the T2-weighted image, and the generator may generate the T2-weighted fat suppression image based on the T1 and T2 images.

Meanwhile, before performing steps 210 and 220 described above, the neural network performs the training process. As an embodiment, the loss due to the generation of the fat suppression image may be discriminated through the discriminator of the neural network. The discriminator may determine whether the generated fat suppression image is true or false. As in the conventional generative adversarial neural network, the training of the generator of the neural network may be performed using the discrimination result of the discriminator as the adversarial loss of the generated image.

Also, the loss due to image reconstruction may be calculated using the decoder of the neural network. For example, the magnetic resonance image input to the encoder may be reconstructed using the Bloch equation. The decoder may generate a magnetic resonance parameter map using the features extracted from the encoder and reconstruct the image using the Bloch equation function. In order to prevent the overfitting problem of the encoder and perform efficient training, the decoder may be trained to identify the values representing the relationship between the T1 image, the T2 image, and the T2 fat suppression image, and to reconstruct the T1 image and T2 image input to the encoder using the Bloch equation. After the training process is sufficiently performed, steps 210 and 220 may be performed.

Figure 3:
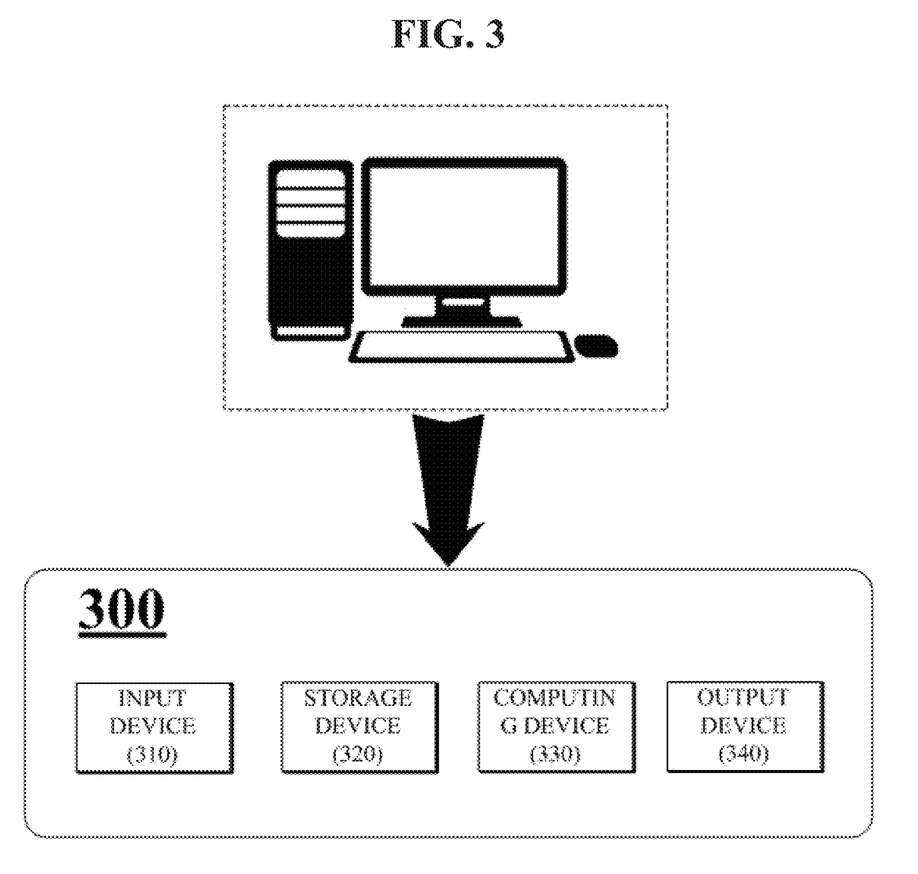
FIG. 3 is a block diagram of a device for generating a fat suppression magnetic resonance image using a generative adversarial neural network based on a Bloch equation according to an embodiment of the disclosed technology.

FIG. 3 is a block diagram of a device for generating a fat suppression magnetic resonance image using a generative adversarial neural network based on a Bloch equation according to an embodiment of the disclosed technology. Referring to FIG. 3, a device 300 for generating a magnetic resonance image includes an input device 310, a storage device 320, and a computing device 330. The device 300 may further include an output device 340.

The input device 310 receives the T1 and T2 magnetic resonance images. The input device may receive the T1-weighted image and the T2-weighted image transmitted from an MRI imaging apparatus as the magnetic resonance image. Of course, a medical staff may directly input an image captured by the MRI imaging device to the input device 310. To this end, the input device 310 may include an interface capable of receiving data corresponding to a magnetic resonance image or receiving an input from a medical staff. The magnetic resonance image may be input through the interface. For example, the magnetic resonance image may be input through an input interface such as a keyboard or a mouse.

The storage device 320 stores the generative adversarial neural network based on a Bloch equation. The storage device 320 may store a pre-trained generative adversarial neural network. Of course, it is also possible to store an initial neural network in which training is not preceded, and then store the updated neural network under the control of the computing device 330. The storage device 320 may be implemented as a memory having a capacity sufficient for storing the generative adversarial neural network. In addition to the neural network, separate data may be further stored. For example, training data for training the neural network may be further stored.

The computing device 330 may extract the features of the magnetic resonance image using the generative adversarial neural network, and generate the T2-weighted fat suppression image based on the extracted features. As described above with reference to FIGS. 1 and 2, the neural network undergoes the training process prior to the generation of the T2-weighted fat suppression image. That is, the loss due to image generation is determined using the discriminator of the neural network, and the loss in reconstructing a magnetic resonance image according to the Bloch equation is calculated using the decoder. The generative adversarial neural network based on a Bloch equation includes the sub-networks of the encoder, the generator, the discriminator, and the decoder. The computing device 330 may extract the features by inputting the input magnetic resonance image to the encoder of the neural network. In addition, it is possible to generate the T2-weighted fat suppression image using the generator. In addition, the loss due to the generation of the fat suppression image may be discriminated using the discriminator, and the image may be reconstructed using the decoder. The computing device may use all four sub-networks in the process of training the generative adversarial neural network. For example, the entire network may be normalized using the loss of the discriminator and the loss of the decoder. After the training is completed, the image may be generated using only the encoder and the generator.

Meanwhile, the device 300 for generating a magnetic resonance image may further include an output device 340 for outputting the generated T2-weighted fat suppression image. The output device 340 may be implemented as a device such as a monitor, and may output the T2-weighted fat suppression image to a screen to provide data for a medical staff to determine a lesion.

Meanwhile, the device 300 for generating a magnetic resonance image as described above may be implemented as a program (or application) including an executable algorithm that may be executed in a computer. The program may be provided by being stored in a temporary or non-transitory computer readable medium.

The non-transitory computer readable medium is a medium that semi-permanently stores data therein and is readable by a device, rather than a medium that stores data therein for a brief moment, such as a register, a cache, a memory, or the like. Specifically, the above-described various applications or programs may be provided by being stored in a non-transitory readable medium such as a compact disc (CD), a digital versatile disc (DVD), a hard disk, a Blu-ray disk, a universal serial bus (USB), a memory card, a read-only memory (ROM), a programmable read only memory (PROM), an erasable programmable read-only memory (erasable PROM (EPROM)), an electrically erasable programmable read-only memory (EEPROM), or a flash memory.

The non-transitory readable medium refers to various random access memories (RAMs) such as a static RAM (SRAM), a dynamic RAM (DRAM), a synchronous DRAM (SDRAM), a double data rate SDRAM (DDR SDRAM), an enhanced SDRAM (ESDRAM), a synclink DRAM (SLDRAM), and a direct rambus RAM (DRRAM).

Figure 4:
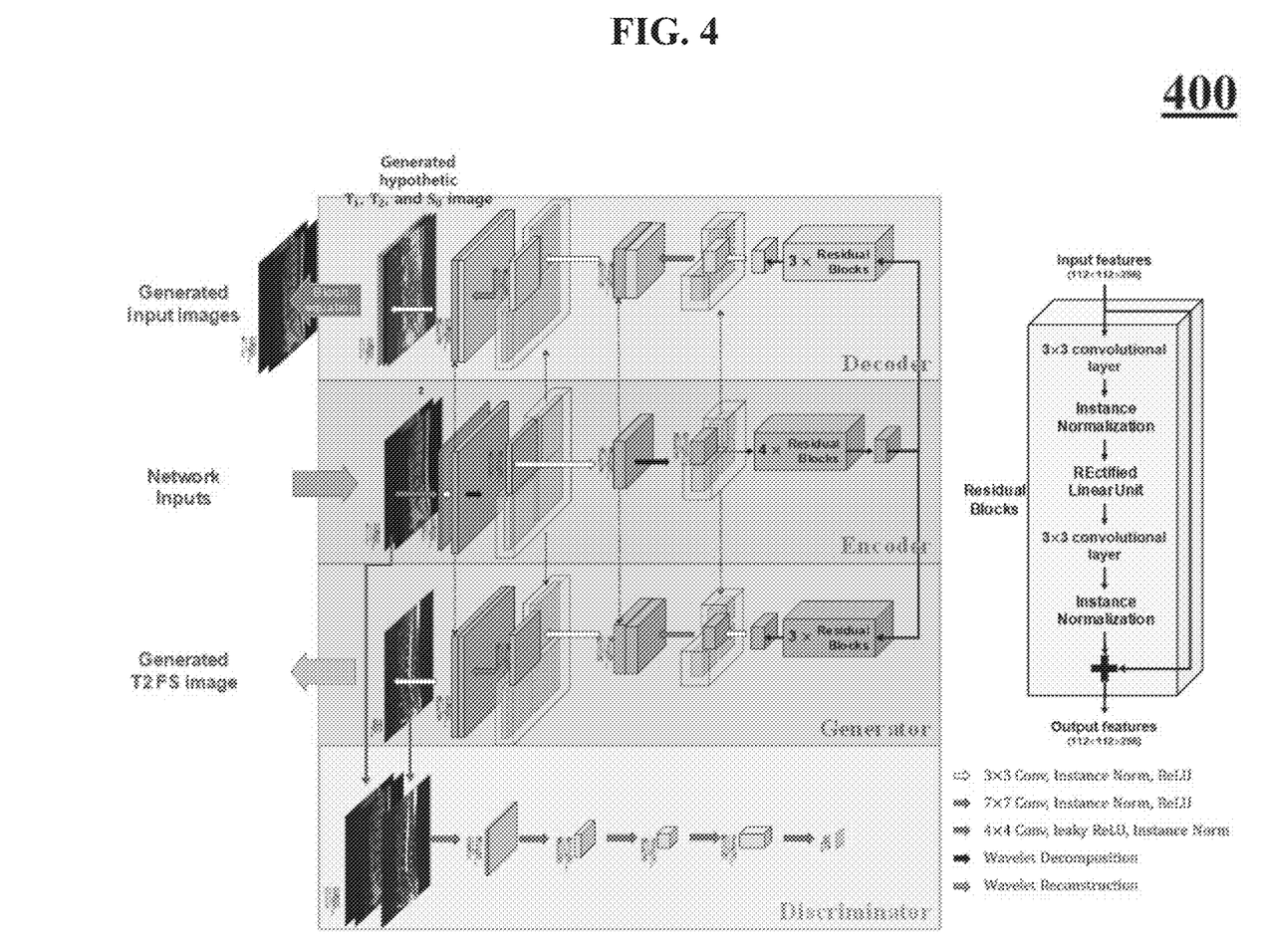
FIG. 4 is a diagram illustrating a structure of a generative adversarial neural network based on a Bloch equation according to an embodiment of the disclosed technology.

FIG. 4 is a diagram illustrating a structure of a generative adversarial neural network based on a Bloch equation according to an embodiment of the disclosed technology. Referring to FIG. 4, the generative adversarial neural network based on a Bloch equation includes the encoder, the generator, the discriminator, and the decoder.

The generative adversarial neural network based on a Bloch equation has a structure in which a conventional generative adversarial neural network and an autoencoder are combined. First, features of an image input through an encoder may be extracted. As illustrated in FIG. 4, the encoder may include a residual block. The features input through the residual block may undergo instance normalization through a 3×3 convolution layer. Unlike batch normalization which calculates an average and standard deviation of a batch, only one image of each mini-batch is calculated according to the instance normalization such that each individual image distribution may be used. Thereafter, it is possible to extract features by performing a ReLU process and then performing the instance normalization and convolution process in reverse once more.

Meanwhile, the generator may generate the fat suppression image based on the extracted features. The generator may generate the T2-weighted fat suppression image based on features of each of the T1-weighted image and the T2-weighted image. When the image is generated in this way, the discriminator may discriminate the loss of the generated image.

Meanwhile, the decoder may generate a hypothetical quantitative magnetic resonance parameter map and reconstruct the image using a Bloch equation suitable for each contrast image. The decoder may identify values representing the relationship between the T1-weighted image, the T2-weighted image, and the T2-weighted fat suppression image, and use the Bloch equation to reconstruct the T1-weighted image and the T2-weighted image input to the encoder into the T2-weighted fat suppression image. According to this process, it is possible to prevent the overfitting problem of the encoder and reflect detailed features in the reconstructed image.

Meanwhile, the adversarial loss function used for training in the generative adversarial neural network based on a Bloch equation according to the disclosed technology is expressed by the following Equation 1.

$$L_{adv} = \tfrac{1}{2} E_X [D(x, Ge(En(x))-1)^2] \quad \text{[Equation 1]}$$

Here, Ge denotes the generator of the neural network, and En denotes the encoder of the neural network. x denotes an input multi-contrast image. The decoder of the neural network is trained to reconstruct the image by identifying the T1 and T2 values and $S_0$ value that are the basis of the relationship between the T1 and T2 images input to the encoder and the T2 fat suppression image generated by the generator. $S_0$ denotes an event-free signal amplitude value and is a value proportional to a proton density value, a voxel size, a data sampling period, the number of phase encoding steps, magnetic field strength, and the like.

Meanwhile, the normalization function used in the neural network is expressed by the following Equation 2.

$$L_R = \frac{1}{w \times h \times 2} \sum_i^w \sum_j^h \sum_k^2 |x_{i,j,k} - B(De(En(x)))_{i,j,k}| \quad \text{[Equation 2]}$$

$$B(t:TR, TE) = t_3 \left(1 - \exp^{-\tfrac{TR}{t1}}\right) \exp^{\tfrac{-TE}{t2}}$$

Here, $TR=TR_{T1-w}$, $TR_{T2-w}$, $TE=TE_{T1-w}$, $TE_{T2-w}$ and $t=\{t1, t2, t3\}$. $t1, t2$ and $t3 \in R^{w \times h}$ represent images for the hypothetical quantitative T1 and T2 values and the event-free signal amplitude value, respectively. De denotes the decoder of the neural network. According to Equation 2, the decoder is trained to generate images for hypothetical quantitative T1 and T2 values, and the $S_0$ values, and may generate $\hat{x}=B(De(En(x)))$ using the given TR, TE, and x values and the equations.

When an input source and a target image are perfectly registered, the training process of most image transformation networks depends on loss functions in units of pixels. However, the loss function in units of pixels aims to train the network to generate mathematically similar images rather than to generate semantically similar images. That is, it is merely determined that the loss functions are similar from a mathematical point of view, and detailed features of the actual original image may be omitted. Therefore, in order to reflect the detailed features of the original image, another loss function that may generate semantically similar images needs to be used. In the process of training a generative adversarial neural network based on a Bloch equation, both a pixelwise l1 loss function $L_{l1}$ and a perceptual loss function $L_{vgg}$ are used. Both loss functions are expressed by the following Equation 3.

$$L_{l1} = \frac{1}{w \times h} \sum_i^w \sum_j^h |y_{i,j} - Ge(En(x))_{i,j}|, \quad \text{[Equation 3]}$$

$$L_{vgg} = \frac{1}{n_k \times w_k \times h_k} \times \sum_c^{n_k} \sum_i^{w_k} \sum_j^{h_k} |VGG_k(y)_{c,i,j} - VGG_k(Ge(En(x)))_{c,i,j}|$$

Here, $VGG_k(y)$ denotes features of a $k^{th}$ convolutional layer of a VGG-16 network pre-trained with an ImageNet data set for an input y, and $n_k$, $w_k$, and $h_k$ represent the number of channels, a width, and a height, respectively. As a result, a total loss function $L_{EDG}$ for the encoder, the decoder, and the generator constituting an image generation part of the generative adversarial neural network based on a Bloch equation is defined as the following equation.

$$L_{EDG} = \lambda_{adv}L_{adv} + \lambda_R L_R + \lambda_{l1}L_{l1} + \lambda_{VGG}L_{VGG} \qquad \text{[Equation 4]}$$

Here, $\lambda_{adv}$, $\lambda_R$, $\lambda_{l1}$, and $\lambda_{VGG}$ denote relative weights for each loss function. As a result, the generative adversarial neural network based on a Bloch equation may be trained in such a way that a sum of weighted adversarial loss $L_{adv}$, normalization loss $L_R$, pixelwise loss $L_{l1}$, and a perceptual loss function $L_{vgg}$ is minimized, respectively.

Figure 5:
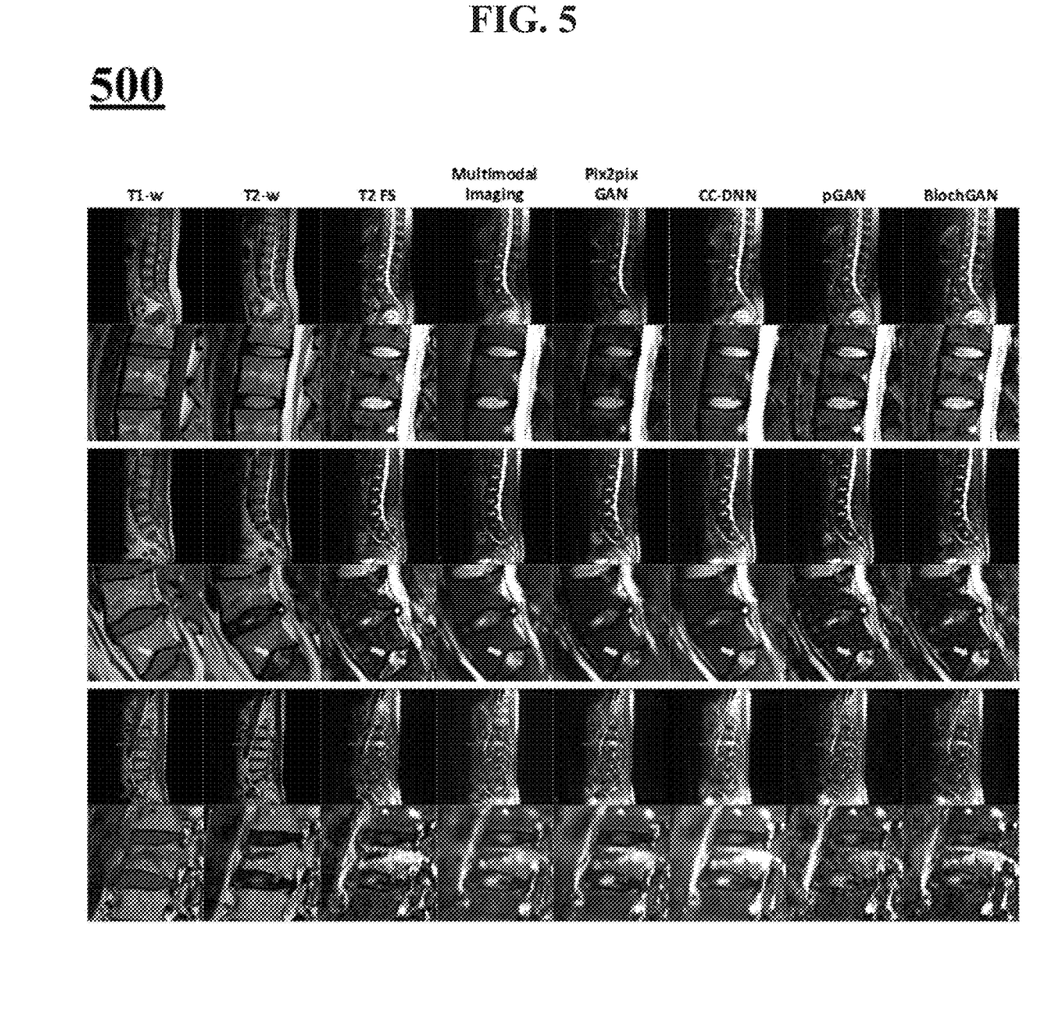
FIG. 5 is a diagram illustrating a comparison of performance of a generative adversarial neural network based on a Bloch equation according to an embodiment of the disclosed technology.

FIG. 5 is a diagram illustrating a comparison of performance of the generative adversarial neural network based on a Bloch equation according to an embodiment of the disclosed technology. In FIG. 5, Bloch-GAN refers to applying normalization to an autoencoder part through appropriate training, Bloch-GAN (NAE) refers to not applying autoencoder normalization, and Bloch-GAN (AE) refers to normalization of the autoencoder part using the conventional method instead of the autoencoder normalization based on the Bloch equation. Images in the first and second rows in FIG. 5 are fetched from a first dataset, and images in the third and fourth rows are fetched from a second dataset. The images in the second and fourth rows represent the enlarged region indicated by a red arrow in the image in the first row.

Although the results of three types of neural networks seem to show similar results, it may be seen that an edema inside a vertebral body is not properly expressed in the Bloch-GAN (NAE) and the Bloch-GAN (AE). On the other hand, referring to the results of the Bloch-GAN that has undergone the normalization based on the Bloch equation, it can be seen that a region corresponding to the edema is brightly displayed. That is, by reflecting the detailed features included in the original image, a contrast value for a lesion region is higher than that of other types of neural networks, and as a result, it is possible to more accurately analyze a lesion.

The method and apparatus for generating a fat suppression magnetic resonance image using a generative adversarial neural network based on a Bloch equation according to embodiments of the disclosed technology has been described with reference to the embodiment shown in the accompanying drawings for better understanding, but this is merely exemplary, and those of ordinary skill in the art will understand that various modifications and other equivalent embodiments are possible therefrom. Accordingly, the true technical protection scope of the disclosed technology should be defined by the appended claims.

What is claimed is:

1. A method of generating a fat suppression magnetic resonance image, comprising:
    inputting, by an imaging device, two magnetic resonance images having different contrasts to an encoder of a neural network to extract features of the magnetic resonance images; and
    generating, by a generator of the neural network, a magnetic resonance image having a contrast different from the two magnetic resonance images based on the features,
    wherein the neural network is trained according to a result of discriminating, by a discriminator of the neural network, a loss due to a generation of a T2-weighted fat suppression image and as a result of reconstructing, by a decoder, the magnetic resonance image input to the encoder using a Bloch equation before the magnetic resonance image is input.

2. The method of claim 1, wherein the two magnetic resonance images input to the encoder are a T1-weighted image and a T2-weighted image obtained by capturing a specific tissue in a body at the same time, and
    the magnetic resonance image generated by the generator is a T2-weighted fat suppression magnetic resonance image.

3. The method of claim 1, wherein the neural network is a generative adversarial neural network based on the Bloch equation (Bloch-GAN).

4. The method of claim 1, wherein the generative adversarial neural network includes an adversarial loss function, a normalized loss function, a pixelwise loss function, and a perceptual loss function as an overall loss function, and is trained so that the overall loss function is minimized.

5. The method of claim 1, wherein the decoder generates a hypothetical magnetic resonance parameter map and reconstructs the magnetic resonance image according to the magnetic resonance parameter map.

6. The method of claim 5, wherein the magnetic resonance parameter map includes a T1 magnetic relaxation rate map, a T2 magnetic relaxation rate map, and a proton density map.

7. A device for generating a fat suppression magnetic resonance image, comprising:
    an input device configured to receive two magnetic resonance images having different contrasts;
    a storage device configured to store a generative adversarial neural network based on a Bloch equation including an encoder, a decoder, a generator, and a discriminator as sub-networks; and
    a computing device configured to extract features of the two magnetic resonance images using the encoder and generate a magnetic resonance image having a contrast different from the two magnetic resonance images based on the extracted features using the generator,
    wherein the generative adversarial neural network based on the Bloch equation is trained according to a result of discriminating, by the discriminator, a loss due to a generation of the magnetic resonance images and as a result of reconstructing, by the decoder, the magnetic resonance image input to the encoder using the Bloch equation before the two magnetic resonance images are input.

8. The device of claim 7, wherein the two magnetic resonance images are a T1-weighted image and a T2-weighted image obtained by capturing a specific tissue in a body at the same time, and
    the magnetic resonance image generated by the generator is a T2-weighted fat suppression magnetic resonance image.

9. The device of claim 7, wherein the generative adversarial neural network includes an adversarial loss function, a normalized loss function, a pixelwise loss function, and a perceptual loss function as an overall loss function, and is trained to minimize the overall loss function.

10. The device of claim 7, wherein the generative adversarial neural network generates a hypothetical magnetic resonance parameter map and reconstructs the magnetic resonance image according to the magnetic resonance parameter map.

11. The device of claim 10, wherein the magnetic resonance parameter map includes a T1 magnetic relaxation rate map, a T2 magnetic relaxation rate map, and a proton density map.

* * * * *